(12) United States Patent
Yamaguchi et al.

(10) Patent No.: US 9,285,079 B2
(45) Date of Patent: Mar. 15, 2016

(54) GAS SUPPLY SYSTEM

(75) Inventors: Yuji Yamaguchi, Kyoto (JP); Tadahiro Yasuda, Kobe (JP)

(73) Assignee: HORIBA STEC, Co., Ltd., Kyoto-shi (JP)

( * ) Notice: Subject to any disclaimer, the term of this patent is extended or adjusted under 35 U.S.C. 154(b) by 477 days.

(21) Appl. No.: 13/559,520

(22) Filed: Jul. 26, 2012

(65) Prior Publication Data
US 2013/0025715 A1    Jan. 31, 2013

(30) Foreign Application Priority Data

Jul. 28, 2011   (JP) ................................ 2011-166067

(51) Int. Cl.
*G05D 11/13* (2006.01)
*F17D 1/00* (2006.01)

(52) U.S. Cl.
CPC ............... *F17D 1/00* (2013.01); *G05D 11/132* (2013.01); *G05D 11/139* (2013.01); *Y10T 137/8593* (2015.04); *Y10T 137/8729* (2015.04); *Y10T 137/87249* (2015.04); *Y10T 137/87314* (2015.04)

(58) Field of Classification Search
CPC ................... Y10T 137/2501; Y10T 137/2562; Y10T 137/2572; Y10T 137/86718; Y10T 137/86807; Y10T 137/87265; Y10T 137/87314; Y10T 137/87249; Y10T 137/7761; Y10T 137/8593; Y10T 137/8729; F17D 1/00; G05D 11/132; G05D 11/139
USPC ................ 137/89, 110–114, 625.28–625.39, 137/599.01–599.07, 597, 487.5
See application file for complete search history.

(56) References Cited

U.S. PATENT DOCUMENTS

| | | | | |
|---|---|---|---|---|
| 3,541,593 A | * | 11/1970 | Weston ........................ | 209/726 |
| 3,662,599 A | * | 5/1972 | Masnik ...................... | 73/861.59 |
| 4,148,311 A | * | 4/1979 | London et al. ........... | 128/204.26 |
| 5,865,205 A | * | 2/1999 | Wilmer ............................ | 137/2 |
| 5,951,772 A | * | 9/1999 | Matsuse et al. ........... | 118/723 R |
| 6,062,256 A | * | 5/2000 | Miller et al. ............... | 137/487.5 |
| 6,162,323 A | * | 12/2000 | Koshimizu ............... | 156/345.26 |
| 6,216,726 B1 | * | 4/2001 | Brown et al. ................. | 137/486 |
| 6,321,782 B1 | * | 11/2001 | Hollister ....................... | 137/557 |
| 6,360,762 B2 | * | 3/2002 | Kitayama et al. ................. | 137/1 |
| 6,418,954 B1 | * | 7/2002 | Taylor et al. ....................... | 137/9 |

(Continued)

FOREIGN PATENT DOCUMENTS

| | | |
|---|---|---|
| JP | 63188210 | 8/1988 |
| JP | 03262116 | 11/1991 |

*Primary Examiner* — William McCalister
(74) *Attorney, Agent, or Firm* — Alleman Hall McCoy Russell & Tuttle LLP

(57) ABSTRACT

A gas supply system is provided. The system includes a plurality of component gas supply pipes, a plurality of flow rate control mechanisms for controlling flow rates of the component gases flowing in the component gas supply pipes, and a material gas supply pipe connected with downstream ends of the component gas supply pipes, and connected with one of the gas supply ports at a downstream. The flow rate control mechanism includes flow rate control valves, individual pressure sensors, and fluid resistance elements provided to the component gas supply pipes in this order from upstream, respectively, a common pressure sensor, and controllers for calculating the flow rates of the gases flowing in the component gas supply and controlling the flow rate control valves of the corresponding component gas supply pipes so that the calculated component gas flow rate approaches a predetermined gas flow rate, respectively.

2 Claims, 8 Drawing Sheets

(56) References Cited

U.S. PATENT DOCUMENTS

| | | | |
|---|---|---|---|
| 6,532,978 B1 * | 3/2003 | Muller-Kuhrt et al. | 137/1 |
| 6,539,968 B1 * | 4/2003 | White et al. | 137/10 |
| 6,578,435 B2 * | 6/2003 | Gould et al. | 73/861.52 |
| 6,581,623 B1 * | 6/2003 | Carpenter et al. | 137/113 |
| 6,591,850 B2 * | 7/2003 | Rocha-Alvarez et al. | 137/9 |
| 6,662,817 B2 * | 12/2003 | Yamagishi et al. | 137/9 |
| 6,752,166 B2 * | 6/2004 | Lull et al. | 137/9 |
| 6,799,603 B1 * | 10/2004 | Moore | 137/597 |
| 6,810,308 B2 * | 10/2004 | Shajii et al. | 700/282 |
| 6,918,406 B2 * | 7/2005 | Bae et al. | 137/340 |
| 6,941,965 B2 * | 9/2005 | Lull et al. | 137/9 |
| 6,945,123 B1 * | 9/2005 | Kuehl et al. | 73/861.42 |
| 7,140,384 B2 * | 11/2006 | Kang et al. | 137/487.5 |
| 7,424,894 B2 * | 9/2008 | Lull et al. | 137/9 |
| 7,673,645 B2 * | 3/2010 | Ding et al. | 137/9 |
| 2004/0055636 A1 * | 3/2004 | Rocha-Alvarez et al. | 137/9 |
| 2004/0168719 A1 * | 9/2004 | Nambu | 137/87.04 |
| 2005/0199342 A1 * | 9/2005 | Shajii et al. | 156/345.26 |
| 2005/0241698 A1 * | 11/2005 | Lull et al. | 137/487.5 |
| 2008/0115834 A1 * | 5/2008 | Geoffrion et al. | 137/9 |

* cited by examiner

GAS SUPPLY SYSTEM

BACKGROUND

The present invention generally relates to a gas supply system that can supply a material gas at different flow rates from a plurality of gas supply ports formed in a device manufacturing chamber, such as a semiconductor manufacturing chamber or a liquid crystal display manufacturing chamber.

Recently, due to an increase in size of a wafer, a semiconductor manufacturing chamber supplied with a material gas from not only one supply port but from a plurality of supply ports at the same time has been developed. However, even if the material gas is supplied at an equal flow rate from each gas supply port of such a chamber, gas concentration may vary on the wafer. Therefore, to equalize the gas concentration on the wafer, the flow rate of the material gas to be supplied from each of the gas supply ports may be varied.

Incidentally, the material gas is a mixture of a plurality of component gases at a predetermined proportion, the plurality of component gases being, for example a major component gas (e.g., $O_2$, Ar and $N_2$) and a minor component gas.

In a semiconductor material gas supply system for supplying the material gas to the semiconductor manufacturing chamber as above, the flow rate is controlled by providing a flow rate control device in each of the component gas flow passages where the component gases are supplied, respectively, and the component gas flow passages are merged into a single passage (a material gas flow passage) so as to combine the component gases to form a material gas therein.

However, in practice, a finely mixed state where the component gases spread uniformly in the main passage is not always achieved. For example, the minor component gas may not mix with the major component gas and, as shown in FIG. 8, a large amount of the minor component gas may flow along an inner wall surface of the material gas flow passage.

In this case, when the material gas flow passage is bifurcated and the material gas is led to each of the gas supply ports of the chamber, one or more of the bifurcated passages may include an excessive amount of the minor component gas, a concentration ratio of the component gases may be different in each bifurcated passage, and as a result, a negative effect may be caused in the manufacturing of a semiconductor.

In order to avoid the above situation, simply, the plurality of component gas flow passages, where one of the component gases flow, may be connected to the gas supply ports, respectively, so that each flow rate in the component gas flow passage is controlled. However, such a structure requires a set of a flow rate control mechanism (a valve), an upstream pressure sensor, a fluid resistance element, and a downstream pressure sensor, for each component gas flow passage, which may lead to a large increase in size and cost.

SUMMARY

The present invention is made in view of the above described situations, and attempts to provide a gas supply system that is as small as possible in size and cost, and can supply a material gas, composed of component gases mixed at an equal concentration ratio, to gas supply ports of a semiconductor manufacturing chamber, and can control each of the flow rates to be different from each other, respectively.

A gas supply system according to the present invention includes a plurality of gas supply devices connected to a plurality of gas supply ports formed in a device manufacturing chamber, in order to supply a material gas composed of a plurality of component gases to the gas supply ports.

Each of the gas supply devices includes a plurality of component gas supply pipes where various kinds of component gases forming the material gas flow, respectively, a flow rate control mechanism for controlling flow rates of the component gases flowing in the component gas supply pipes, respectively, and a material gas supply pipe connected with downstream ends of the component gas supply pipes at an upstream end thereof, and connected with one of the component gas supply ports at a downstream end. The flow rate control mechanism includes flow rate control valves, individual pressure sensors, and fluid resistance elements provided to the component gas supply pipes in this order from upstream, respectively, a common pressure sensor provided either in the material gas supply pipe or downstream of any of the fluid resistance elements in the component gas supply pipes, and controllers for calculating the flow rates of the gases flowing in the component gas supply pipes based on pressures measured by the corresponding individual pressure sensors of the component gas supply pipes, respectively, and a pressure measured by the common pressure sensor, and controlling the flow rate control valves of the corresponding component gas supply pipes so that the calculated component gas flow rate becomes closer to, i.e., approaches, a predetermined gas flow rate, respectively.

Further, the flow rate control mechanism may include fluid resistance elements, individual pressure sensors, and flow rate control valves provided to the component gas supply pipes in this order from upstream, respectively, a common pressure sensor provided either in a common supply pipe or upstream of any of the fluid resistance elements in the component gas supply pipes, the common supply pipe being a bundle of upstream end parts of the component gas supply pipes where the same kind of component gas flows, and controllers for calculating the flow rates of the gases flowing in the component gas supply pipes based on pressures measured by the corresponding individual pressure sensors of the component gas supply pipes, respectively, and a pressure measured by the common pressure sensor, and controlling the flow rate control valves of the corresponding component gas supply pipes so that the calculated component gas flow rate becomes closer to a predetermined gas flow rate, respectively.

The gas supply system may also be configured to include a flow rate measuring mechanism to the present system instead of the flow rate control mechanism, and the flow rate control mechanism may be provided separately.

In this case, the flow rate measuring mechanism may include individual pressure sensors and fluid resistance elements provided to the component gas supply pipes in this order from upstream, respectively, a common pressure sensor provided either one of in the material gas supply pipe and downstream of any of the fluid resistance elements in the component gas supply pipes, and calculators for calculating the flow rates of the gases flowing in the component gas supply pipes based on pressures measured by the corresponding individual pressure sensors of the component gas supply pipes, respectively, and a pressure measured by the common pressure sensor.

Further, the flow rate measuring mechanism may include fluid resistance elements and individual pressure sensors provided to the component gas supply pipes in this order from upstream, respectively, a common pressure sensor provided either one of in a common supply pipe and upstream of any of the fluid resistance elements in the component gas supply pipes, the common supply pipe being a bundle of upstream end parts of the component gas supply pipes where the same kind of component gas flows, and calculators for calculating the flow rates of the gases flowing in the component gas supply pipes based on pressures measured by the corresponding individual pressure sensors of the component gas supply pipes, respectively, and a pressure measured by the common pressure sensor.

Thus, with the above configuration, the gas supply device is provided for each gas supply port, and each of the flow rates of the material gas and each of the ratios of the component gases forming the material gas can be controlled independently, variations in the component gas ratios that have occurred conventionally in cases where the flow is simply divided can certainly be avoided.

Moreover, the plurality of component gas supply pipes are provided to each gas supply device. Generally, a pressure sensor is required one each upstream and downstream of the fluid resistance element to measure the flow rate of the gas flowing in the component gas supply device; however, when the plurality of pressure sensors are required downstream of the material gas supply pipes, a single common pressure sensor provided to the material gas supply pipe substitutes thereof, and when the plurality of pressure sensors are required upstream of the material gas supply pipes, a single common pressure sensor provided to the common supply pipe substitutes thereof. Therefore, increases in size and cost can be suppressed as much as possible.

Note that, according to the configuration of the present invention, the common pressure sensors are required for the same number of material gas supply pipes. Whereas, although it tends to be considered that the common pressure sensor is further preferably provided in the chamber so that the number of the common pressure sensors is reduced to one, in practice, because the pressure is different inside the chamber, especially near the gas supply ports, an accurate measurement of flow rate is difficult with only one pressure sensor. In other words, according to the present invention, accurate measurement and control of the flow rate can be performed.

DETAILED DESCRIPTION

Hereinafter, an embodiment of a semiconductor material gas supply system according to the present invention is described in detail with reference to the appended drawings.

Figure 1:
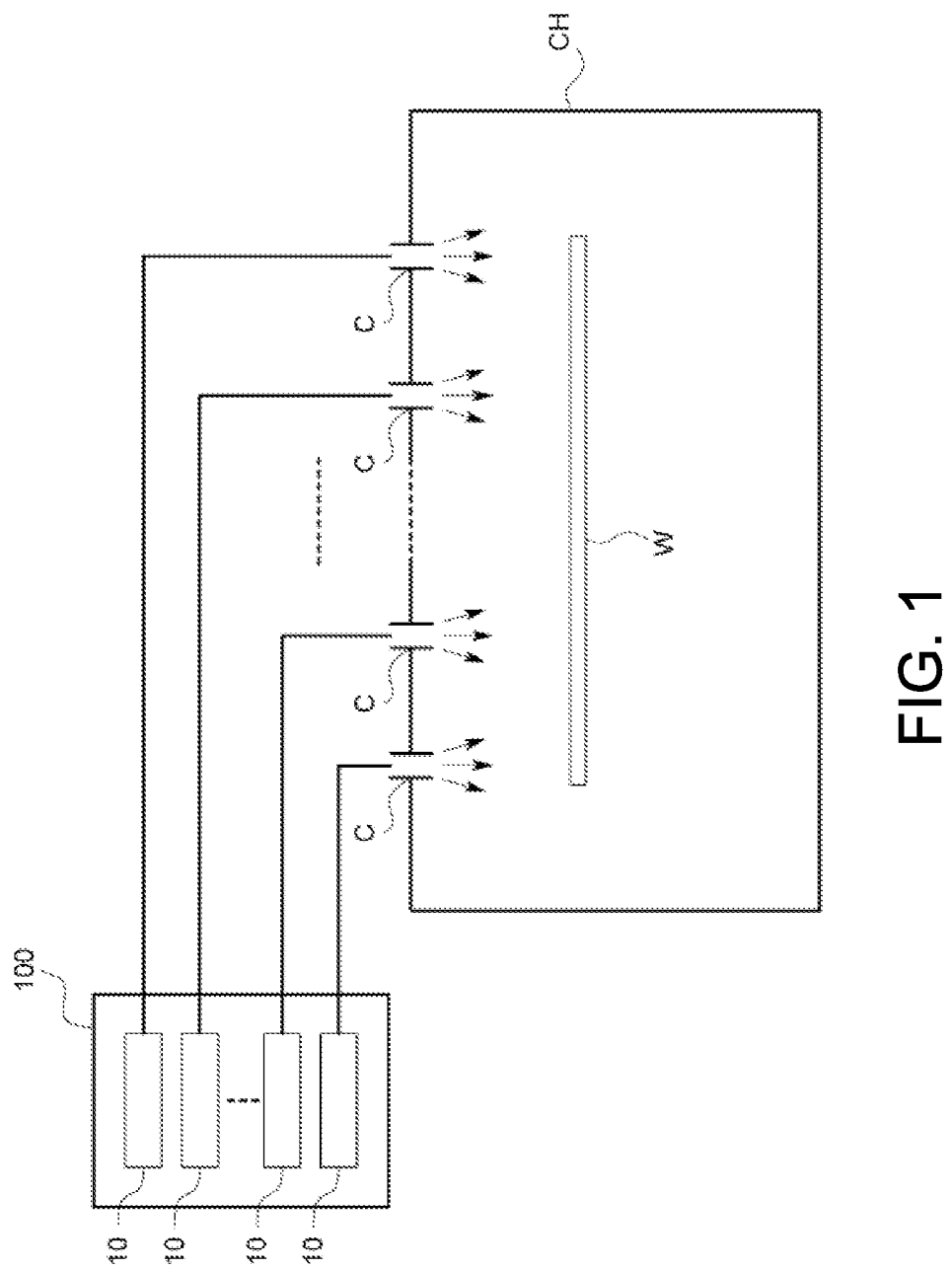
FIG. 1 is a schematic diagram showing an outline of a semiconductor manufacturing chamber according to an embodiment of the invention.
Figure 2:
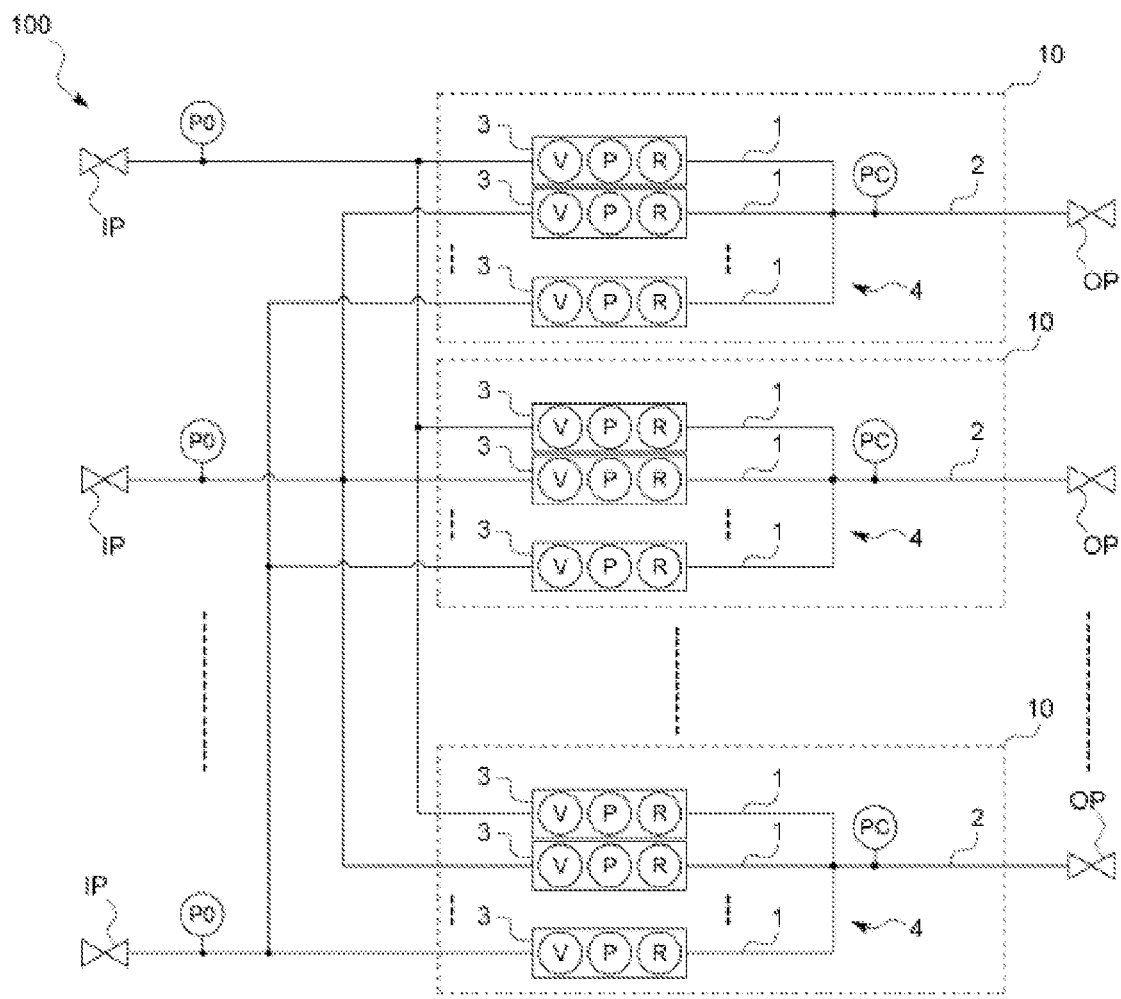
FIG. 2 is an example of a fluid circuit diagram of a gas supply system of the embodiment.

As shown in FIGS. 1 and 2, a semiconductor material gas supply system 100 of this embodiment includes a plurality of gas supply devices connected to a plurality of gas supply ports C, respectively. The plurality of gas supply ports C are formed in a semiconductor manufacturing chamber CH.

As shown in FIG. 1, the semiconductor manufacturing chamber CH performs plasma etching on, for example, a wafer W stored therein, and a material gas to be used for the plasma etching is supplied from the plurality of gas supply ports C formed above the wafer W. Note that, as explained above, the material gas is composed of a plurality of gases used as components, respectively (hereinafter, each gas used as a component is referred to as a "component gas").

A respective gas supply device 10 is connected to each of the gas supply ports C.

As shown in the fluid circuit diagram of FIG. 2, each of the gas supply devices 10 includes a plurality of component gas supply pipes 1 arranged in parallel to each other, a material gas supply pipe 2, and a flow rate control mechanism 4 for controlling flow rates of the gases flowing in the component gas supply pipes 1. Hereinafter, each of the above pipes and mechanisms are explained in detail.

An upstream end of the component gas supply pipe 1 is connected with a gas inlet port IP so that one kind of component gas provided from the gas inlet port IP flows therein. Further, in this embodiment, kinds of the component gases flowing in the component gas supply pipes 1 are different in each pipe. Note that, the reference symbol "PO" indicates a pressure sensor for checking whether a pressure at the gas inlet port IP is within a predetermined pressure range.

The material gas supply pipe 2 is a pipe where the component gases flowing in the component gas supply pipes 1 merge and flow therein. An upstream end of the material gas supply pipe 2 is connected with the downstream ends of the component gas supply pipes 1, and a downstream end of the material gas supply pipe 2 is connected with the gas supply port C through a gas inlet port OP. In this manner, the component gases flowing through the component gas supply pipes 1 are mixed through the material gas supply pipe 2, and are supplied to the gas supply port C as the material gas for manufacturing a semiconductor.

Figure 3:
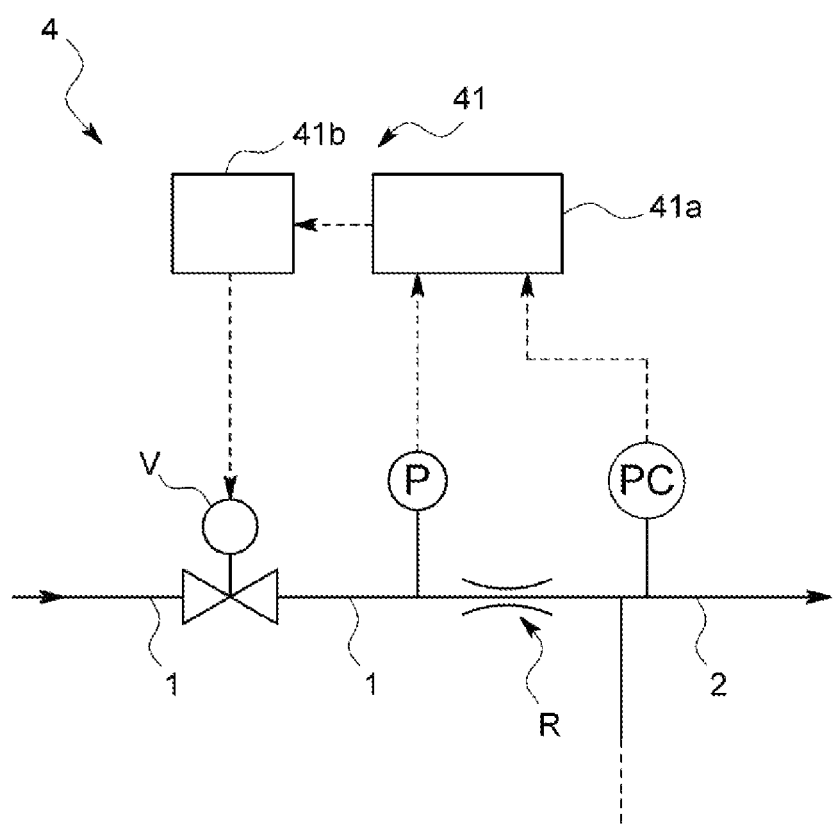
FIG. 3 is a fluid circuit diagram of a flow rate control mechanism of the embodiment.

The flow rate control mechanism 4 includes a flow rate control valve V, an individual pressure sensor P, and a fluid resistance element R respectively provided on each component gas supply pipe 1 in this order from upstream to downstream, as well as a common pressure sensor PC independently provided on the material gas supply pipe 2, and a respective controller set 41 for controlling the flow rates of the gases flowing in each component gas supply pipes 1 (see FIG. 3).

Each of the flow rate control valves V adjusts a valve opening by using, for example, a piezoelectric element. Each of the individual pressure sensors P leads the gas to, for example, a diaphragm chamber (not illustrated), and detects the gas pressure according to a displacement amount of a diaphragm provided in the diaphragm chamber. Each of the fluid resistance elements R has a narrow tube therein for the gas to pass therethrough.

Figure 4:
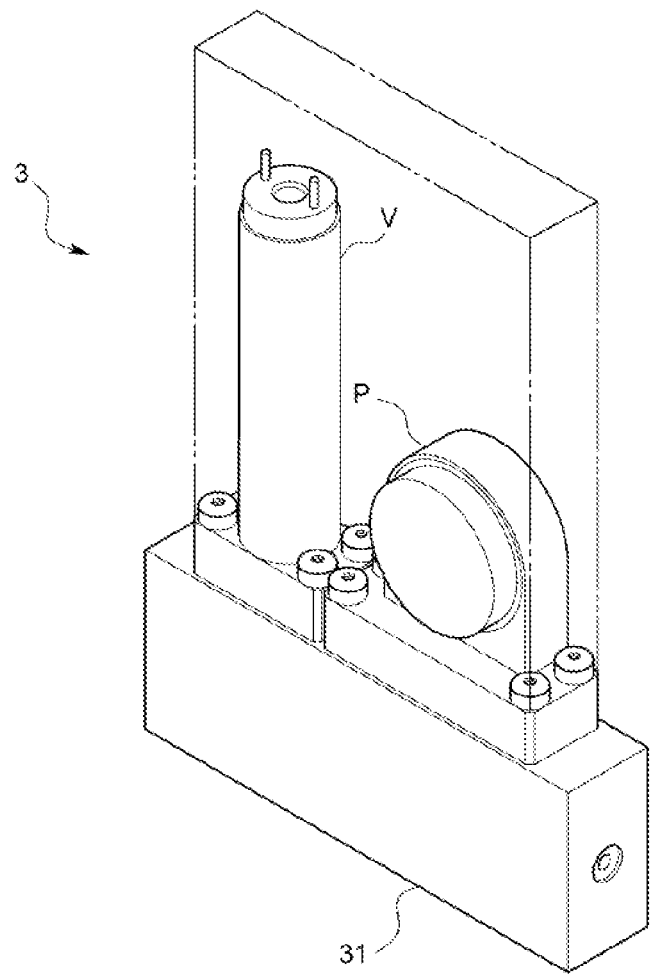
FIG. 4 is an overall perspective view of a unit body of the embodiment.

Note that, in this embodiment, as shown in FIG. 4, the flow rate control valve V, the individual pressure sensor P, and the fluid resistance element R are integrally attached to, for example, a rectangular-shaped body 31 to be unitized (hereinafter, may be referred to as "the unit body 3").

Physically, a plurality of unit bodies 3 are fixed abreast of each other to adhere to side faces of the adjacent bodies 31 so as to form a so called gas panel formed in a plane overall.

Figure 5:
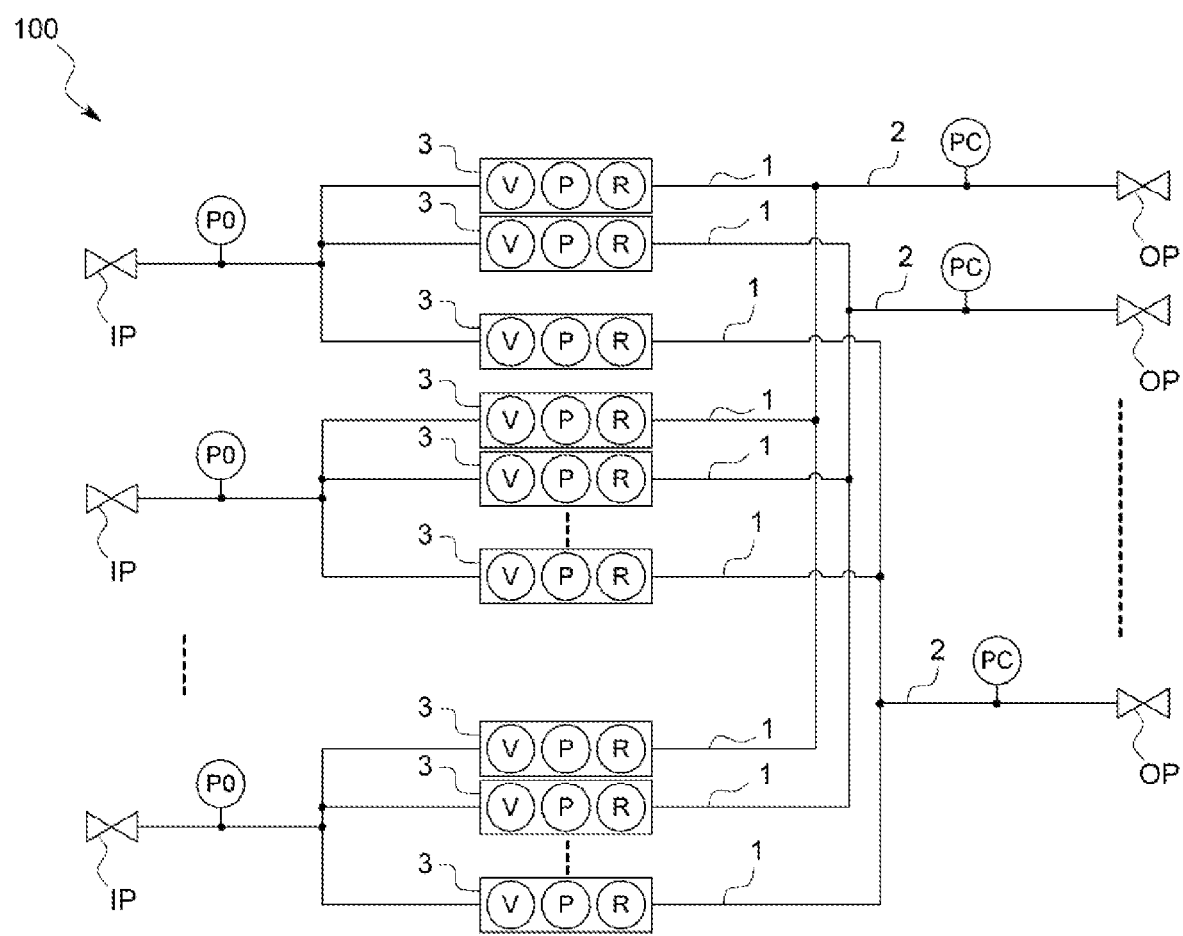
FIG. 5 is another example of the fluid circuit diagram of a gas supply system of the embodiment.

Note that, for an actual physical placement, as shown in FIG. 5, the unit bodies 3 where the same component gas flows may be collected and placed adjacently in each gas supply device 10, and as shown in FIG. 2, the unit bodies 3 may be collected to be adjacent to each other in every gas supply device 10.

The common pressure sensor PC is structurally the same as the individual pressure sensor P, and is provided near a merging point which is at the upstream end of the material gas supply pipe 2 where the component gas supply pipes 1 merge. Here, in FIGS. 2 and 5, functions of the hydraulic circuits are equivalent.

Each of the controller sets 41 is physically constituted by, for example, a CPU or other processor for executing various programs, a memory, an AD converter, and an analog electric circuit. The CPU and its peripheral equipment co-operate according to a predetermined program stored in a memory to function as, for example, as shown in FIG. 3, a flow rate calculator 41a for calculating the flow rate of the gas flowing in the component gas supply pipe 1 based on a pressure (an upstream pressure) measured by the individual pressure sensor P of the corresponding component gas supply pipe 1 and a pressure (a downstream pressure) measured by the common pressure sensor PC, and, a control output unit 41b for outputting a control signal to the flow rate control valve V of the component gas supply pipe 1 so that the calculated gas flow rate becomes closer to a predetermined gas flow rate.

Next, an operation of the semiconductor material gas supply system 100 configured as detailed above is described.

When the flow rate of the material gas to be supplied from each of the gas supply ports C is determined, because the ratio of each component gas forming the material gas is predetermined, each of the component gas flow rates, that is, a flow rate to be set by each flow rate control mechanism 4, is determined for each gas supply device 10.

Further, the flow rate control mechanism 4 feedback-controls the flow rate of the component gas so that it becomes the set flow rate. In this manner, the material gas in which the component gases are mixed at a predetermined ratio is supplied inside the chamber CH at a desired flow rate from each gas supply port C.

Thus, with the above configuration, the gas supply device 10 is provided for each gas supply port C, and each of the flow rates of the material gas and each of the ratios of the component gases forming the material gas can be controlled independently, the variation of component gas ratios that has occurred conventionally in a case where the flow is simply divided can certainly be avoided.

Moreover, for each gas supply device 10, a plurality of component gas supply pipes 1 are provided. Heretofore, pressure sensors have been required on each side of the fluid resistance element R to measure the flow rate of the gas flowing in the component gas supply device 10. However, according to the present invention, the plurality of downstream pressure sensors that would have been required heretofore are rendered unnecessary, and instead a single common pressure sensor PC is provided on the material gas supply pipe 2. Therefore, increases in size and cost can be suppressed to a large extent.

In addition, because the flow rate of each component gas is settable, there is a merit of being able to freely control the mixture ratio and the total flow rate of the component gases.

Note that, although it tends to be considered that the common pressure sensor PC is further preferably provided in the chamber CH so that the number of the common pressure sensors is reduced to one, in practice, because the pressure is different inside the chamber CH, especially near the gas supply ports C, an accurate measurement of flow rate is difficult with only one pressure sensor. In other words, according to the present invention, the number of pressure sensors can be reduced to a minimum level where accurate measurement and control of the flow rate can be performed.

Note that, the present invention is not limited to the above embodiment and may be modified as below. In the following modified embodiments, the same reference numerals are applied to members corresponding to the above embodiment.

Figure 6:
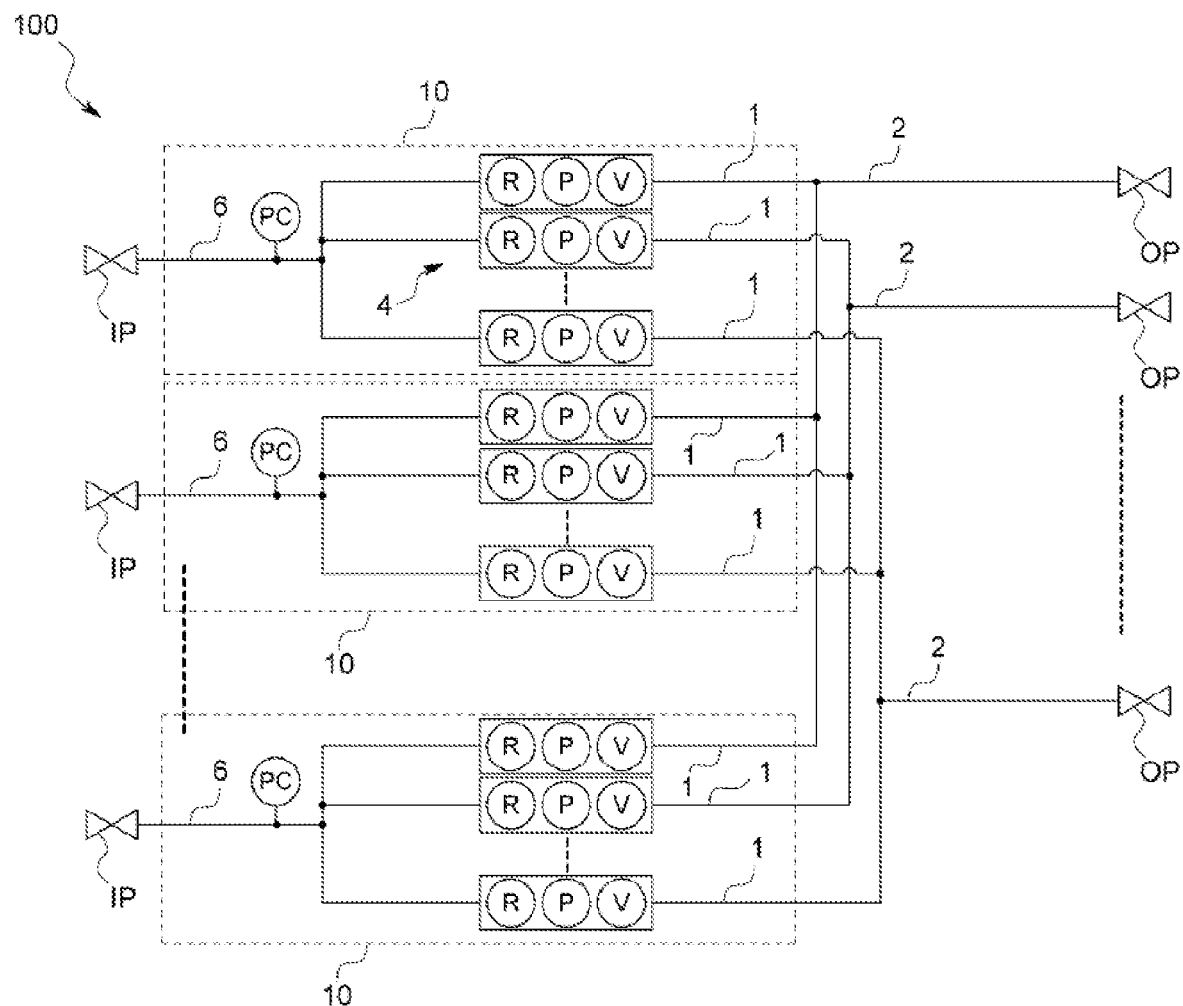
FIG. 6 is a fluid circuit diagram of a gas supply system of another embodiment of the invention.

For example, as shown in FIG. 6, the fluid resistance element R, the individual pressure sensor P, and the flow rate control valve V may be provided to each component gas supply pipe 1 in this order from upstream to downstream, and the common pressure sensor PC may be provided to a common supply pipe 6 which is a bundle of upstream ends of the component gas supply pipes 1 where the same component gas flows therein.

Further, only one of the component gas supply pipes where the same component gas flows in the above embodiment may be provided without the flow rate control valve, and provided with only the fluid resistance element. In this case, a flow rate control mechanism for controlling a total flow rate of the component gas is required to be provided because, if the flow rates in the other component gas supply pipes and the total flow rate are controlled, the flow rate in the component gas supply pipe without the flow rate control valve can also be controlled.

Similarly, in each gas supply device, only one of the component gas supply pipes may be provided without the flow rate control valve, and provided with only the fluid resistance element. In this case, a flow rate control mechanism for controlling a total flow rate of the material gas supplied by the gas supply device is required to be provided because, if the flow rates in the other component gas supply pipes and the total flow rate are controlled, the flow rate of the component gas supply pipe without the flow rate control valve can also be controlled.

One common pressure sensor may be provided commonly for at least two component gas pipes. In other words, for example, when four component gas supply pipes are used, a common pressure sensor may be provided for every two pipes. Thus, in the case where four component gas supply pipes are used, the number of common pressure sensors is two.

Figure 7:
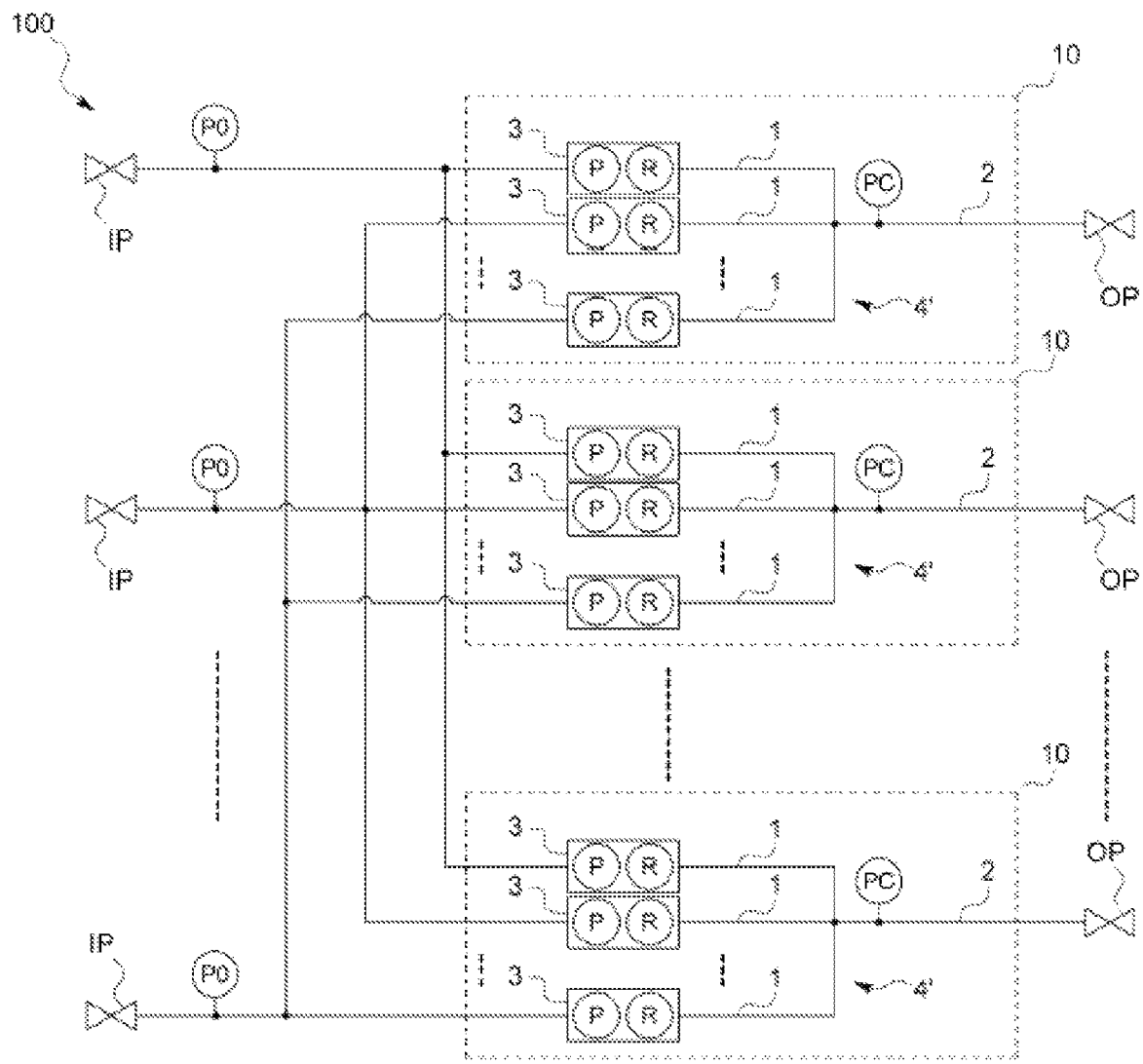
FIG. 7 is a fluid circuit diagram of a gas supply system of further another embodiment of the invention.
Figure 8:
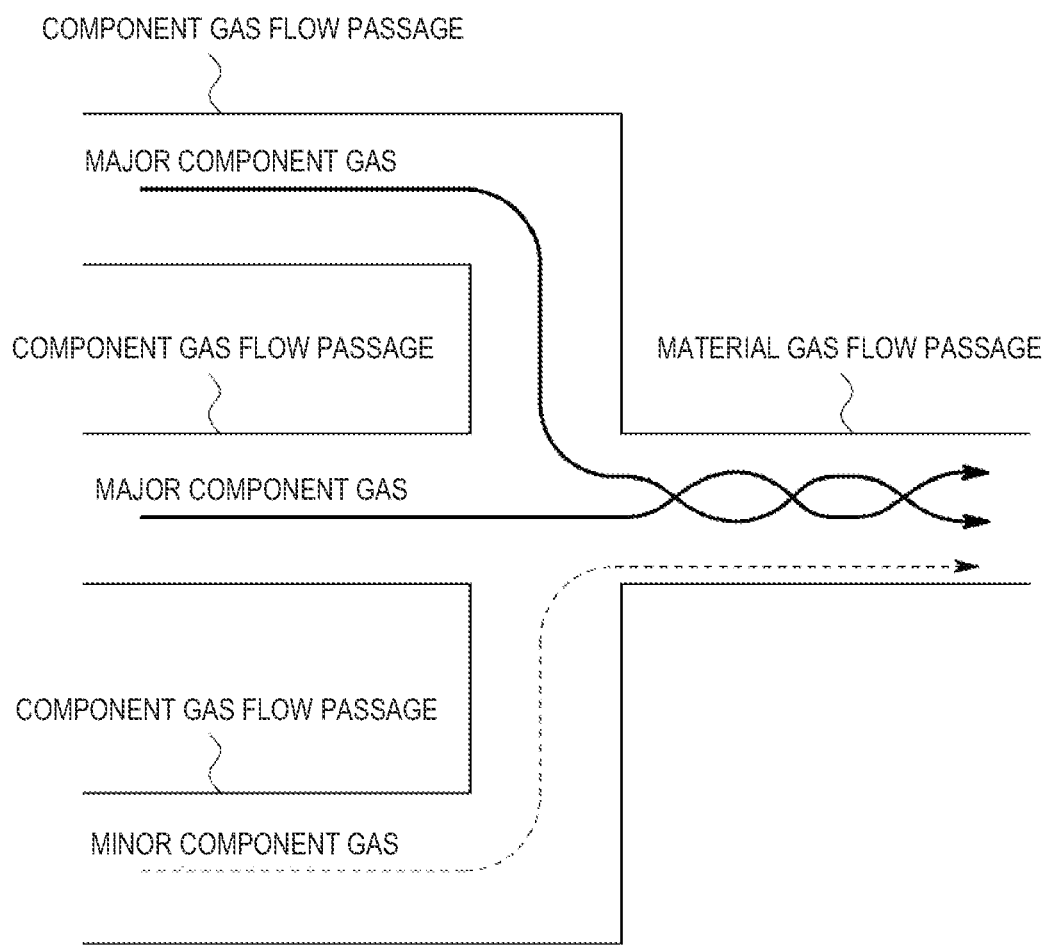
FIG. 8 is an explanatory view schematically showing how component gases are mixed with each other.

Further, as shown in FIG. 7, the flow rate control valves V may be excluded from the unit bodies 3, and the unit bodies 3 may operate as a flow rate measuring mechanism 4'. In this case, a mechanism for controlling the flow rates may be provided additionally.

Moreover, the present invention may be applied to not only gas but also various kinds of fluids including liquids, and applied to not only in semiconductor manufacturing processes but also, for example, in liquid crystal device manufacturing processes.

Furthermore, the present invention may be applied with various kinds of modifications within the range of not deviating from the spirit and scope of the present invention, such as partially combining the modified embodiments.

DESCRIPTION OF REFERENCE NUMERALS

100 Semiconductor Material Gas Supply System
10 Gas Supply Device
1 Component Gas Supply Pipe
2 Material Gas Supply Pipe
4 Flow Rate Control Mechanism
41 Controller
CH Semiconductor Manufacturing Chamber
C Gas Supply Port
V Flow Rate Control Valve
P Individual Pressure Sensor
R Fluid Resistance Element PC Common Pressure Sensor

The invention claimed is:

1. A gas supply system comprising:
first and second gas supply devices, each connected to a respective plurality of gas supply ports formed in a device manufacturing chamber, each of the first and second gas supply devices being configured to supply a material gas composed of a plurality of component gases to the gas supply ports;
wherein each of the first and second gas supply devices includes:
  first and second component gas supply pipes, the first component gas supply pipe of the first gas supply device being confluently connected on a downstream side to the first component gas supply pipe of the second gas supply device, and the second component gas supply pipe of the first gas supply device being confluently connected on a downstream side to the second component gas supply pipe of the second gas supply device; and
  first and second unit bodies, each of the first and second unit bodies being coupled to a respective one of the component gas supply pipes and configured to control a respective flow rate of the corresponding component gas flowing in the respective one of the component gas supply pipes;
a first material gas supply pipe fluidly connected at an upstream side thereof with the first component gas supply pipes of the first and second gas supply devices, and connected at a downstream end thereof with one of the gas supply ports;
a first common pressure sensor configured to sense a first pressure in the fluidly connected region of the first material gas supply pipe and first component gas supply pipes;
a second material gas supply pipe fluidly connected at an upstream side thereof with the second component gas supply pipes of the first and second gas supply devices and connected at a downstream end thereof with one of the gas supply ports;
a second common pressure sensor configured to sense a second pressure in the fluidly connected region of the second material gas supply pipe and second component gas supply pipes; and
a controller;
wherein the first and second unit bodies of the first gas supply device are placed adjacently;
wherein the first and second unit bodies of the second gas supply device are placed adjacently;
wherein each unit body includes:
  a flow rate control valve, an individual pressure sensor, and a fluid resistance element provided on each component gas supply pipe associated with the respective unit body in this order from upstream to downstream, respectively, within the respective gas supply device, the common pressure sensors being provided downstream of the fluid resistance elements;
wherein the controller is configured to calculate the flow rates of each of the component gases flowing in each of the first component gas supply pipe of the first gas supply device and the first component gas supply pipe of the second gas supply device based on respective pressures measured by the corresponding individual pressure sensors of each of the first unit body of the first gas supply device and first unit body of the second gas supply device, and further based on the first pressure measured by the first common pressure sensor, the controller also being configured to control each of the flow rate control valves of the first unit body of the first gas supply device and first unit body of the second gas supply device so that the calculated component gas flow rate for each of the respective component gas supply pipes of the first unit body of the first gas supply device and the first unit body of the second gas supply device approach respective predetermined gas flow rates; and
wherein the controller is further configured to calculate the flow rates of each of the component gases flowing in each of the second component gas supply pipe of the first gas supply device and the second component gas supply pipe of the second gas supply device based on respective pressures measured by the corresponding individual pressure sensors of each of the second unit body of the first gas supply device and second unit body of the second gas supply device, and further based on the second pressure measured by the second common pressure sensor, the controller also being configured to control each of the flow rate control valves of the second unit body of the first gas supply device and second unit body of the second gas supply device so that the calculated component gas flow rate for each of the respective component gas supply pipes of the second unit body of the first gas supply device and the second unit body of the second gas supply device approach respective predetermined gas flow rates.

2. A gas supply system comprising:
first and second gas supply devices, each connected to a respective plurality of gas supply ports formed in a device manufacturing chamber, each of the first and second gas supply devices being configured to supply a material gas composed of a plurality of component gases to the gas supply ports;
wherein each of the first and second gas supply devices includes:
  first and second component gas supply pipes, the first component gas supply pipe of the first gas supply device being confluently connected on a downstream side to the first component gas supply pipe of the second gas supply device, and the second component gas supply pipe of the first gas supply device being confluently connected on a downstream side to the second component gas supply pipe of the second gas supply device; and
  first and second unit bodies, each of the first and second unit bodies being coupled to a respective one of the component gas supply pipes and configured to control a respective flow rate of the corresponding component gas flowing in the respective one of the component gas supply pipes;
a first material gas supply pipe fluidly connected at an upstream end thereof with the first component gas supply pipes of the first and second gas supply devices, and connected at a downstream end thereof with one of the gas supply ports;
a first common pressure sensor configured to sense a first pressure in the fluidly connected region of the first material gas supply pipe and first component gas supply pipes;
a second material gas supply pipe fluidly connected at an upstream side thereof with the second component gas supply pipes of the first and second gas supply devices and connected at a downstream end thereof with one of the gas supply ports;

a second common pressure sensor configured to sense a second pressure in the fluidly connected region of the second material gas supply pipe and second component gas supply pipes;

a controller; and a calculator;

wherein the first and second unit bodies of the first gas supply device are placed adjacently;

wherein the first and second unit bodies of the second gas supply device are placed adjacently;

wherein each unit body includes:

a flow rate control valve provided on each component gas supply pipe associated with the respective unit body within the respective gas supply device; and an individual pressure sensor and a fluid resistance element provided on each component gas supply pipe associated with the respective unit body in this order from upstream to downstream, respectively, within the respective gas supply device, the common pressure sensors being provided downstream of the fluid resistance elements;

wherein the controller is configured to control the flow rate of the component gas flowing in the respective component gas supply pipe associated with the respective unit body; and wherein the calculator is configured to calculate the flow rates of each of the component gases flowing in each of the respective component gas supply pipes that are confluently connected based on respective pressures measured by the corresponding individual pressure sensors of each component-gas supply pipe, and further based on the pressure measured by the corresponding common pressure sensor in the fluidly connected region of the confluently connected component gas supply pipes and associated material gas supply pipe.

* * * * *